(12) United States Patent
Yoon et al.

(10) Patent No.: US 10,374,195 B2
(45) Date of Patent: Aug. 6, 2019

(54) ADHESIVE FILM AND ORGANIC ELECTRONIC DEVICE INCLUDING THE SAME

(71) Applicant: SHINWHA INTERTEK CORP, Cheonan-si (KR)

(72) Inventors: Sung Chul Yoon, Seongnam-si (KR); Cheol Heung Ahn, Cheonan-si (KR); Hwi Yong Lee, Osan-si (KR); Ji Woong Park, Daejeon (KR); Dong Hyun Kim, Cheonan-si (KR); Geoung Min Shin, Suwon-si (KR)

(73) Assignee: SHINWHA INTERTEK CORP (KR)

( * ) Notice: Subject to any disclaimer, the term of this patent is extended or adjusted under 35 U.S.C. 154(b) by 0 days.

(21) Appl. No.: 16/024,034

(22) Filed: Jun. 29, 2018

(65) Prior Publication Data

US 2019/0006624 A1  Jan. 3, 2019

(30) Foreign Application Priority Data

Jun. 29, 2017  (KR) .................. 10-2017-0082429
May 23, 2018  (KR) .................. 10-2018-0058148

(51) Int. Cl.
*H01L 51/52*  (2006.01)

(52) U.S. Cl.
CPC .................. *H01L 51/5259* (2013.01)

(58) Field of Classification Search
None
See application file for complete search history.

(56) References Cited

U.S. PATENT DOCUMENTS

2013/0240862 A1* 9/2013 Yoo ............... H01L 51/5246
                                                    257/40
2017/0155086 A1* 6/2017 Kang ............. H01L 27/3262

FOREIGN PATENT DOCUMENTS

| JP | 2005-243556 A1 | 9/2005 |
| JP | 2014-500586 A1 | 1/2014 |
| KR | 2012-0039753 A1 | 4/2012 |
| KR | 10-1552628 B1 | 9/2015 |

* cited by examiner

*Primary Examiner* — Thien F Tran
(74) *Attorney, Agent, or Firm* — Alston & Bird LLP

(57) ABSTRACT

An adhesive film and an organic electronic device including the same are provided. The adhesive film includes: a first bonding layer including a first bonding component layer, a moisture absorbent, and first core shell particles; and a second bonding layer disposed below the first bonding layer and including second core shell particles, which are formed of a different material from the first core shell particles, wherein each of the first core shell particles includes a first shell and a first core surrounded by the first shell and each of the second core shell particles includes a second shell and a second core surrounded by the second shell.

20 Claims, 7 Drawing Sheets

ADHESIVE FILM AND ORGANIC ELECTRONIC DEVICE INCLUDING THE SAME

This application claim priorities to Korean Patent Application No. 10-2017-0082429, filed on Jun. 29, 2017, and No. 10-2018-0058148, filed on May 23, 2018. And all the benefits accruing therefrom under 35 U.S.C. § 119, the disclosure of which is incorporated herein by reference in its entirety.

BACKGROUND

1. Field

The present disclosure relates to an adhesive film and an organic electronic device, and more particularly, to an adhesive film for use in the encapsulation of an organic electronic device such as an organic light-emitting diode (OLED) display device and an organic electronic device including the adhesive film.

2. Description of the Related Art

In recent years, interest in flexible electronic devices has increased, and organic electronic devices, such as circuit boards, electronic components, and display devices, using organic materials having excellent flexibility have been developed. However, in order to have flexibility, organic electronic devices need to be formed to be sufficiently thin and have a small number of components. Also, organic materials are relatively unstable against moisture and oxygen. For example, the quality and lifetime of an organic light-emitting diode (OLED) display device using an organic material as a light-emitting layer may rapidly deteriorate due to the influence of moisture, and thus, an excellent encapsulation technique capable of preventing the penetration of foreign materials such as moisture or oxygen into the organic material is needed.

As an encapsulation structure for an organic electronic device, an adhesive film having a moisture-absorbing capability may be attached on top of an organic electronic device. However, as the adhesive film absorbs moisture and expands accordingly, the surface roughness of the organic electronic device may increase, or damage (such as a bend or crack) may be caused to the organic electronic device. Thus, the amount of a moisture absorbent added needs to be limited, and the amount of the moisture absorbent added cannot be increased indefinitely accordingly. As a result, the water vapor transmission rate (WVTR) characteristics of the organic electronic device cannot be sufficiently improved.

SUMMARY

Exemplary embodiments of the present disclosure provide an adhesive member with improved water vapor transmission rate (WVTR) characteristics.

Exemplary embodiments of the present disclosure also provide an organic electronic device with improved WVTR characteristics.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, an adhesive film includes: a first bonding layer including a first bonding component layer, a moisture absorbent, and first core shell particles; and a second bonding layer disposed below the first bonding layer and including second core shell particles, which are formed of a different material from the first core shell particles, wherein each of the first core shell particles includes a first shell and a first core surrounded by the first shell and each of the second core shell particles includes a second shell and a second core surrounded by the second shell.

According to an exemplary embodiment of the present disclosure, an organic electronic device includes a substrate; an organic material element disposed on the substrate; and the above-described adhesive film disposed on the organic material element.

According to the aforementioned exemplary embodiments of the present disclosure, since the first core shell particles are included in the first bonding layer of the adhesive film and absorb a deformation force generated by the moisture absorbent, the surface deformation of the first bonding layer can be prevented, a relatively large amount of the moisture absorbent can be injected, and thus, WVTR characteristics can be improved.

Also, according to the aforementioned exemplary embodiments of the present disclosure, since the adhesive film is disposed on a passivation layer and the first core shell particles are included in the first bonding layer of the adhesive film and absorb a deformation force generated by the moisture absorbent, the surface deformation of the first bonding layer can be further prevented, a relatively large amount of the moisture absorbent can be injected, and thus, WVTR characteristics can be further improved.

Other features and exemplary embodiments may be apparent from the following detailed description, the drawings, and the claims.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
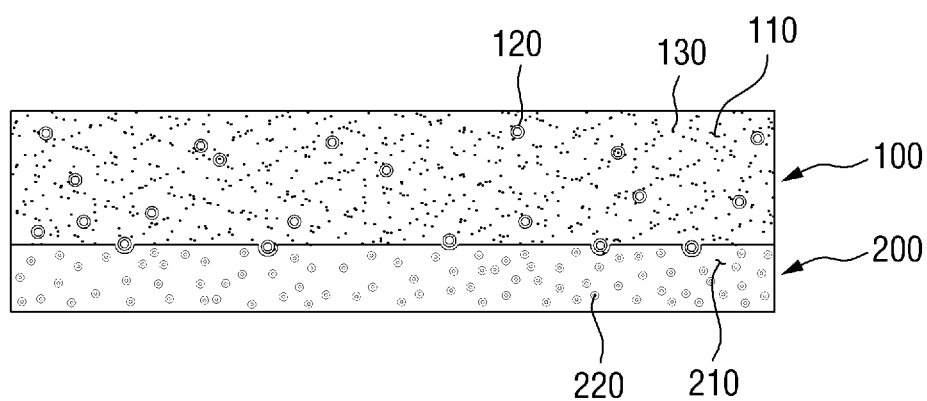
FIG. 1 is a cross-sectional view of an adhesive film according to an exemplary embodiment of the present disclosure.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

It will be understood that when an element or layer is referred to as being "on," or "connected to" another element or layer, it can be directly on or connected to the other element or layer or intervening elements or layers may be present. In contrast, when an element is referred to as being "directly on," or "directly connected to" another element or layer, there are no intervening elements or layers present. As used herein, connected may refer to elements being physically and/or electrically connected to each other. As used herein, the term "and/or" includes any and all combinations of one or more of the associated listed items.

It will also be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terms "sheet" and "film" are used herein interchangeably. Also, as used herein, the term "bonding" encompasses both bonding and adhesion.

Exemplary embodiments of the present disclosure will hereinafter be described with reference to the accompanying drawings.

Figure 2:
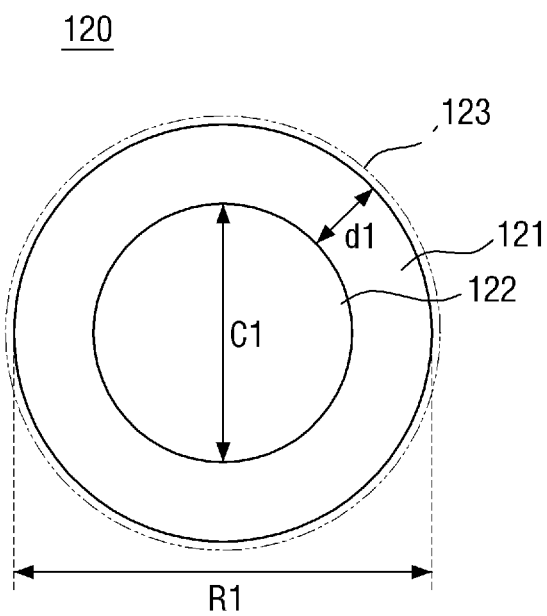
FIG. 2 is a cross-sectional view of a first core shell particle according to an exemplary embodiment of the present disclosure.
Figure 3:
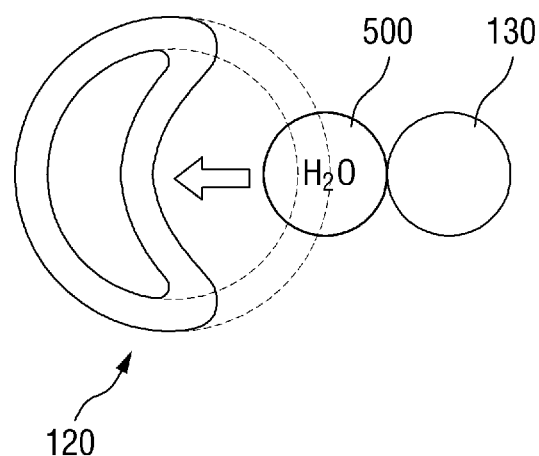
FIG. 3 is a cross-sectional view showing how each first core shell particle in a first bonding component layer absorbs a deformation force.
Figure 4:
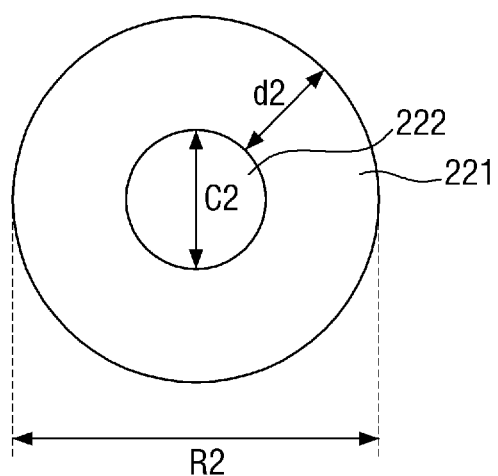
FIG. 4 is a cross-sectional view of a second core shell particle according to an exemplary embodiment of the present disclosure.

FIG. 1 is a cross-sectional view of an adhesive film according to an exemplary embodiment of the present disclosure. FIG. 2 is a cross-sectional view of a first core shell particle according to an exemplary embodiment of the present disclosure. FIG. 3 is a cross-sectional view showing how each first core shell particle in a first bonding component layer absorbs a deformation force. FIG. 4 is a cross-sectional view of a second core shell particle according to an exemplary embodiment of the present disclosure.

Referring to FIGS. 1 through 4, an adhesive film 10 includes a first bonding layer 100 and a second bonding layer 200, which is stacked below the first bonding layer 100. The order in which the first and second bonding layers 100 and 200 are stacked may vary. The first bonding layer 100 may be disposed to be further apart than the second bonding layer 200 from an object to be encapsulated. When the adhesive film 10 is used as an encapsulation member for an organic electronic device such as, for example, an organic light-emitting diode (OLED) display device, the second bonding layer 200 (particularly, the bottom surface of the second bonding layer 200) may be attached on a passivation layer of the OLED display device. A cover layer may be attached on the first bonding layer 100 (particularly, the top surface of the first bonding layer 100). This will be described later in detail.

The first bonding layer 100 includes a first bonding component layer 110, a moisture absorbent 130, and first core shell particles 120. The moisture absorbent 130 and the first core shell particles 120 are provided in the first bonding component layer 110. The moisture absorbent 130 and the first core shell particles 120 may be evenly distributed in the first bonding component layer 110.

The first bonding component layer 110 may impart an adhesive performance to the first bonding layer 100 and may provide a space in which the moisture absorbent 130 and the first core shell particles 120 can be distributed. The first bonding component layer 110 may have a thickness of 10 μm to 100 μm.

The first bonding component layer 110 may comprise a material containing at least one functional group selected from among a thermosetting or photocurable glycidyl group, an isocyanate group, a hydroxyl group, a carboxyl group, an alkenyl group, an alkynyl group, and an acrylate group. The first bonding component layer 110 may preferably comprise a polyolefin-based resin.

The moisture absorbent 130 is contained in the first bonding component layer 110 and absorbs moisture. The moisture absorbent 130 may have a particle size of 0.01 μm to 0.3 μm, but the present disclosure is not limited thereto.

The moisture absorbent 130 may include a mixture of one or more kinds of metal powders such as alumina, metal oxides such as alkali earth metal oxide or an organic metal oxide, metal salts, or phosphorous pentoxide ($P_2O_5$). Examples of the metal oxides include, but are not limited to, lithium oxide ($Li_2O$), sodium oxide ($Na_2O$), barium oxide (BaO), calcium oxide (CaO), and magnesium oxide (MgO), and examples of the metal salts include, but are not limited to, sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$), metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride ($CsF$), tantalum fluoride ($TaF_5$), niobium fluoride ($NbF_5$), lithium bromide ($LiBr$), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodine ($Mg_2$), and metal chlorates such as barium perchlorate ($Ba(ClO_4)_2$) or magnesium perchlorate ($Mg(ClO_4)_2$). A physical absorbent such as silica, zeolite, titania, zirconia, or montmorillonite may be used as the moisture absorbent 130.

Preferably, CaO may be used as the moisture absorbent 130. CaO becomes transparent when absorbing moisture and can thus show the degree of absorption of moisture. Thus, the occurrence of defects that may be caused by an encapsulation material during the fabrication of a display panel can be prevented.

The first core shell particles 120 mitigate separation of the first bonding layer 100 from the second bonding layer 200 when the first bonding layer 100 absorbs moisture and thus expands.

Each of the first core shell particles 120 includes a first core 122 and a first shell 121. The first shell 121 surrounds the first core 122. The first shell 121 may completely surround the first core 122. Alternatively, the first shell 121 may only partially surround the first core 122.

The first shell 121 may comprise a material such as polyvinylidene chloride (PVDC) or polymethyl methacrylate (PMMA).

The first core 122 may be empty or filled with a gas such as hydrocarbon. The first core shell particles 120 may be foamed particles.

An average diameter C1 of the first core 122 may be greater than a thickness d1 of the first shell 121. For example, the thickness d1 of the first shell 121 may be 0.1 μm to 2 μm, and the average diameter C1 of the first core 122 may be 10 μm to 40 μm. A size R1 of the first core shell particle 120 may be 10.2 μm and 44 μm.

In one exemplary embodiment, at least some of the first core shell particles 120 may be impregnated in the first bonding component layer 110. For example, if the first core shell particles 120 have a sufficient specific gravity, at least some of the first core shell particles 120 may be impregnated in the first bonding component layer 110 during the fabrication of the adhesive film 10 and may then be placed at or near the interface between the first and second bonding layers 100 and 200. When the first core shell particles 120 are disposed at the interface between the first and second bonding layers 100 and 200, the first core shell particles 120 may protrude toward the second bonding layer 200. As a result, the area of the bonding interface between the first and second bonding layers 100 and 200 may increase, and the bonding force between the first and second bonding layers 100 and 200 may also increase. In order to increase the amount of first core shell particles 120 impregnated, the first core shell particles 120 may preferably be formed to have a greater specific gravity than the first bonding component layer 110. However, even if the first core shell particles 120 have the same specific gravity as, or a smaller specific gravity than, the first bonding component layer 110, some of the first core shell particles 120 still can be arranged at or near the interface between the first and second bonding layers 100 and 200.

In some exemplary embodiments, each of the first core shell particles 120 may further include a surface coating layer 123. The surface coating layer 123 may be formed on the surface of the first shell 121. The surface coating layer 123 may comprise, for example, calcium carbonate ($CaCO_3$). When each of the first core shell particles 120 includes the surface coating layer 123, the specific gravity of the first core shell particles 120 may further increase. For example, if the specific gravity of the first core shell particles 120 is 0.1 or less when the surface coating layer 123 is included in each of the first core shell particles 120, the specific gravity of the first core shell particles 120 may increase about 0.15 to 1.5 times when the surface coating layer 123 is included in each of the first core shell particles 120. As a result, the first core shell particles 120 can be further impregnated in the first bonding component layer 110 and can thus improve the bonding force between the first and second bonding layers 100 and 200. If the surface coating layer 123 is included in each of the first core shell particles 120, the coagulation of the first core shell particles 120 can be prevented, and the dispersibility of the first core shell particles 120 can be improved. Accordingly, the productivity and the handling of the first core shell particles 120 can be improved.

In one exemplary embodiment, the surface coating layer 123 may comprise a silane material. The silane group of the silane material is interposed between the surface coating layer 123, which comprises calcium carbonate, and the surface of the first shell 121 and bonds the surface coating layer 123 and the surface of the first shell 121. The silane material may also bond parts of the surface coating layer 123, which comprises calcium carbonate, together. When each of the first core shell particles 120 includes the surface coating layer 123 containing calcium carbonate and/or a silane group, the first core shell particles 120 may be hydrophilic.

When the first core shell particles 120 are foamed particles, the surface coating layer 123 of each of the first core shell particles 120 may be formed by a coating process following a foaming process for forming foamed particles.

As illustrated in FIG. 3, if moisture 500 infiltrates into the first bonding layer 100, the moisture 500 may be absorbed by the first bonding component layer 110 or the moisture absorbent 130. If the moisture 500 is absorbed by the first bonding layer 100, the moisture 500 may push its surroundings by as much as its volume, i.e., may swell. As a result, a deformation force that can deform the surroundings of the moisture 500 may be generated. If the mitigation or absorption of the deformation force fails, stress may be delivered to the first bonding component layer 110. As a result, the surface shape of the first bonding layer 100 may be deformed, and the bonding force between the adhesive film 10 and an object to which the adhesive film 10 is attached may weaken.

The first core shell particles 120 prevent stress from being delivered to the first bonding component layer 110 by absorbing the deformation force generated by the moisture 500, and thereby prevent the surface shape of the first bonding layer 100 from being deformed. The deformation force generated by the moisture 500 is transmitted along the first bonding component layer 110. When the deformation force reaches each of the first core shell particles 120, the first shell 121 is crushed into the first core 122 and thus absorbs some of the deformation force. For this, the first shell 121 preferably has a weak deformation strength. Specifically, the shrinkage deformation force of the first core shell particles 120 may be weaker than the surface deformation force of the first bonding component layer 110, and thus, the first core shell particles 120 may preferably be easily deformable. Since, as already mentioned, the first core 122 is hollow or filled with a gas, the first core shell particles 120 is easily shrinkable and deformable and can thus absorb the deformation force generated by the moisture 500. Once the first core shell particles 120 absorb the deformation force, the volume of the first core 122 decreases, and the first shell 121 may be crushed into the first core 122.

The first core shell particles 120 may be disposed in the first bonding component layer 110 together with the moisture absorbent 130. Thus, the first core shell particles 120 can mitigate, at a close distance, the deformation force generated by the moisture 500 absorbed by the moisture absorbent 130. When the first core shell particles 120 are evenly distributed in the first bonding component layer 110, the first core shell particles 120 can absorb the deformation force generated by the moisture 500, which is infiltrated into the first bonding layer 100 through various paths, and can thus effectively prevent or suppress the deformation of the surface shape of the first bonding layer 100. Also, as already mentioned, if some of the first core shell particles 120 are disposed at the bottom of the first bonding component layer 110 that forms the interface between the first and second bonding layers 100 and 200, the area of the bonding interface between the first and second bonding layers 100 and 200 may increase, and as a result, the bonding force between the first and second bonding layers 100 and 200 may increase.

Since in the exemplary embodiment of FIGS. 1 through 4, the first core shell particles 120 absorb at least some of the deformation force generated by the moisture 500, the surface deformation of the first bonding layer 100 can be prevented, even if the content of the moisture absorbent 130 increases. In other words, in the absence of the first core shell particles 120, the moisture absorbent 130 needs to be limited to a certain amount in order to avoid swelling due to the absorption of the moisture 500. However, in the presence of the first core shell particles 120, the surface swelling of the first bonding layer 100 can be alleviated, and thus, a relatively large amount of moisture absorbent 130 can be injected. Therefore, the moisture absorption and the water vapor transmission rate (WVTR) characteristics of the first bonding layer 100 can be further improved.

The content of the moisture absorbent 130 in the first bonding layer 100 may be 10% to 80% or 30 to 60% by weight of the total weight of the first bonding component layer 110. The content of the moisture absorbent 130 can be increased due to the presence of the first core shell particles 120.

The content of the first core shell particles 120 is related to the content of the moisture absorbent 130. The content of the first core shell particles 120 may be high if the content of the moisture absorbent 130 is high, and may be low if the content of the moisture absorbent 130 is low. The content of the first core shell particles 120 in the first bonding layer 100 may be 0.01% to 3% by weight of the moisture absorbent 130. When the content of the first core shell particles 120 is 0.01% or more by weight of the moisture absorbent 130, the deformation force generated by absorbed moisture can be significantly alleviated. By satisfying the above-described range of the content of the first core shell particles 120, the content of the moisture absorbent 130 in the first bonding layer 100 can be further increased. On the other hand, when the content of the first core shell particles 120 is too high, the bonding strength of the first bonding layer 100 may be lowered. However, when the content of the first core shell particles 120 is 3% or less by weight of the moisture absorbent 130, the bonding strength of the first bonding layer 100 can be maintained. Therefore, the content of the first core shell particles 120 may preferably be 0.05% to 2% by weight of the moisture absorbent 130 in view of the alleviation of the deformation force generated by absorbed moisture and the maintenance of the bonding strength of the first bonding layer 100.

The volume expansion rate of the first bonding layer 100 is determined by the content of the moisture absorbent 130 and the content of the first core shell particles 120. The greater the content of the moisture absorbent 130, the greater the volume expansion rate of the first bonding layer 100. The first core shell particles 120 offset, to some extent, the expansion of the volume of the first bonding layer 100, caused by the absorption of moisture by the moisture absorbent 130. If the content of the moisture absorbent 130 is large enough to exceed the volume canceling effect of the first core shell particles 120, the volume of the first bonding layer 100 may expand. However, if the volume of the first bonding layer 100 expands too excessively, the bonding force of the first bonding layer 100 may deteriorate and may thus cause peeling or cracking of the first bonding layer 100. To suppress the expansion of the volume of the first bonding layer 100, the content of the first core shell particles 120 may be increased in proportion to the content of the moisture absorbent 130. However, if the content of the first core shell particles 120 and the content of the moisture absorbent 130 are increased too much, the content ratio (or the volume ratio) of the first bonding component layer 110 in the first bonding layer 110 may decrease, and as a result, the bonding force of the first bonding layer 100 may weaken.

Thus, to secure a sufficient bonding force, the ratio of the volume of the first bonding s1 component layer 110 to the volume of the entire first bonding layer 100 may preferably be 60% or higher. Specifically, the ratio of the volume of the first bonding component layer 110 to the volume of the entire first bonding layer 100 may be set to be in the range of 60% to 80% in consideration of the volume of the moisture absorbent 130 and the volume of the first core shell particles 120.

A volume expansion rate for preventing cracking of the first bonding layer 100 may be 118% or lower. In one exemplary embodiment, the volume expansion rate for preventing cracking of the first bonding layer 100 may be in the range of 103% to 118%. The volume expansion rate for preventing cracking of the first bonding layer 100 may be defined by Equation 1 below.

$$\text{Volume Expansion Rate (\%)} = ((V1+V2)/V1)*100 \qquad \text{<Equation 1>}$$

Referring to Equation 1, V1 denotes the volume of the first bonding component layer 110, and V2 denotes a maximum volume increase that may be caused by the absorption of moisture by the moisture absorbent 130 and is equal to, or greater than, 0.

The maximum volume increase V2 may be represented by Equation 2 below.

$$V2=(W+S)/D-(V3+V4) \qquad \text{<Equation 2>}$$

Referring to Equation 2, W denotes the weight of the moisture absorbent 130 of the first bonding component layer 110, S denotes the saturated moisture absorption amount of the moisture absorbent 130, and D represents the density of the moisture absorbent 130 with moisture absorbed therein. The saturated moisture absorption amount S and the density D of the moisture absorbent 130 are determined by the type of the moisture absorbent 130. For example, when CaO is used as the moisture absorbent 130, the saturated moisture absorption amount S of the moisture absorbent 130 may be 28.5 wt %. CaO has a density of 3.35 g/cm³ when moisture is yet to be absorbed thereinto. However, once moisture is absorbed in CaO, CaO is transformed into Ca(OH)$_2$, and its density becomes 2.21 g/cm³.

Referring again to Equation 2, V3 and V4 denote the volume of the moisture absorbent 130 and the volume of the first core shell particles 120, respectively.

Equation 2 above shows the result of subtracting the volume V3 of the moisture absorbent 130 and the volume V4 of the first core shell particles 120 from the volume of the moisture absorbent 130 with a maximum amount of moisture absorbed therein, particularly, a pure volume increase in the moisture absorbent 130 caused by the absorption of moisture, excluding the amount by which the expansion of the volume of the moisture absorbent 130 is offset by the first core shell particles 120.

The first bonding layer 100 can be provided with a favorable water through velocity (WTV) characteristic by securing a sufficient amount of moisture absorbent 130 in the first bonding layer 100 as long as the ratio of the volume of the first bonding component layer 110 to the volume of the entire first bonding layer 100 can be maintained at or above 60% and the volume expansion rate of the first bonding layer 110 can be maintained at or below 118%. As will be described later in connection with Experimental Examples 1 and 6, WTV may be measured by measuring the length by which each sample is penetrated by moisture in a reliable chamber for 1,000 hours. Specifically, the WTV of the first bonding layer 100 may be measured by bonding the first bonding layer 100 to a rectangular glass plate, measuring the maximum penetration length of moisture into each of the four sides of the glass plate, and averaging the results of the measurement.

The first bonding layer 100 may have a WTV of, for example, 2.0 mm/1,000 hr. Preferably, the first bonding layer 100 may have a WTV of 1.5 mm/1,000 hr or less.

In one exemplary embodiment, the content of the moisture absorbent 130 may be 110% to 140% by weight of the first bonding component layer 110, and the content of the first core shell particles 120 may be 0.2% to 0.8% by weight of the first bonding component layer 110.

The second bonding layer 200 is disposed below the first bonding layer 100. Specifically, the second bonding layer 200 is disposed on the bottom surface of the first bonding layer 100. The second bonding layer 200 may completely overlap with the first bonding layer 100.

The second bonding layer 200 may include a second bonding component layer 210 and second core shell particles 220. The top surface of the second bonding component layer 210 may be placed in contact with, and attached to, the bottom surface of the first bonding component layer 110. The second bonding component layer 210 may impart a bonding performance to the second bonding layer 200.

The second bonding component layer 210 may comprise a material containing at least one functional group selected from among a thermosetting or photocurable glycidyl group, an isocyanate group, a hydroxyl group, a carboxyl group, an alkenyl group, an alkynyl group, and an acrylate group. The second bonding component layer 210 may preferably comprise a polyolefin-based resin. The second bonding layer 200, unlike the first bonding layer 100, may not include the moisture absorbent 130 and the first core shell particles 120. The second bonding component layer 210 may be formed of the same material as, or a different material from, the first bonding component layer 110.

Specifically, the second bonding component layer 210 may comprise a material having a smaller molecular weight, viscosity, and hardness than the first bonding component layer 110. The first bonding component layer 110 is attached to a cover base made of a metal or the like. Since binders having a high molecular weight generally have an excellent moisture barrier property and excellent heat resistance, the first bonding component layer 110 may include a material having a molecular weight of about one million as a binder. On the other hand, since the second bonding component layer 210 is attached to a passivation layer, the bonding strength with respect to edge portions of the passivation layer having a height difference from the rest of the passivation layer is important. If the molecular weight of the second bonding component layer 210 is high, the second bonding component layer 210 may undesirably be detached from the corners of the edge portions of the passivation layer. Thus, the second bonding component layer 210 may include a binder having an excellent flowability, but as low a molecular weight as, for example, about 150,000.

The thickness of the second bonding layer 200 may be smaller than the thickness of the first bonding layer 100. For example, the thickness of the first bonding layer 100 may be 5 μm to 50 μm. In one exemplary embodiment, the thickness of the first bonding layer 100 may be, but is not limited to, about 40 μm, and the thickness of the second bonding layer 200 may be, but is not limited to, about 10 μm. The second bonding layer 200 may have the same thickness as, or a greater thickness than, the first bonding layer 100.

The second core shell particles 220 may be distributed in the second bonding component layer 210.

Each of the second core shell particles 220 may include a second core 222 and a second shell 221. The second shell 121 surrounds the second core 222. The second shell 221 may completely surround the second core 222. Alternatively, the second shell 221 may only partially surround the second core 222.

The second shell 221 may comprise a polymer material. When the second shell 221 comprises a polymer material, damage to the surroundings of the second shell 221, for example, the second bonding component layer 210 and/or a bonding part between the second core shell 221 and the second bonding component layer 210, can be reduced. Also, the second shell 221 may be formed of a material having a higher transition temperature. If the transition temperature of the material of the second shell 221 is high, the high-temperature heat resistance of the second core shell particles 220 can be improved. The second shell 221 may be formed of, for example, polystyrene (PS) or polymethyl methacrylate (PMMA).

The second core 222 may be empty or filled with a flowable material. For example, the second core 2322 may be filled with a gas such as the air, nitrogen, or argon.

The second core shell particles 220 may be produced by introducing polymer chains into a circular shape during the synthesis of a polymer material.

The second core shell particles 220 may have a smaller size than the first core shell particles 120. If the second core shell particles 220 are as large as the first core shell particles 120, the structure (such as, for example, a passivation layer, glass, or the like) where the adhesive film 10 is attached and/or a bonding part between the structure and the adhesive film 10 may be cracked or damaged during high-temperature heat resistance testing, and as a result, the WVTR characteristics of the second bonding layer 200 may be degraded. On the other hand, if the second core shell particles 220 are too large in size, the second core shell particles 220 may not be suitable for covering height differences on the structure (such as, for example, a panel circuit) where the adhesive film 10 is attached. Thus, by reducing the size of the second core shell particles 220, the high-temperature heat resistance of the second bonding layer 200 can be enhanced, cracking in, and damage to, the structure (such as, for example, a passivation layer, glass, or the like) where the adhesive film 10 is attached and/or the bonding part between the structure and the adhesive film 10 can be minimized, and height differences on the structure (such as, for example, a panel circuit) can be effectively alleviated.

The relative size of core shell particles in each bonding layer to the thickness of each bonding layer may be greater in the first bonding layer 100 than in the second bonding layer 200. That is, the ratio of the average size of the first core shell particles 120 to the thickness of the first bonding layer 100 may be greater than the average size of the second core shell particles 220 to the thickness of the second bonding layer 200. Also, the ratio of the average size of the first core shell particles 120 to the average size of the second core shell particles 220 may be greater than the ratio of the thickness of the first bonding layer 100 to the thickness of the second bonding layer 200.

A thickness d2 of the second shell 221 may be the same as, or smaller than, an average diameter C2 of the second core 222. For example, the thickness d2 of the second shell 221 may be 0.1 μm to 0.8 μm, and the diameter C2 of the second core 222 may be 0.1 μm to 0.2 μm. A size R2 of the second core shell particles 220 may be 0.3 μm to 1.8 μm. The specific gravity of the second core shell particles 220 may be greater than the specific gravity of the first core shell particles 120.

The content of the second core shell particles 220 in the second bonding layer 200 may be 20% by weight of the moisture absorbent 130 in the first bonding layer 100. The content of the second core shell particles 220 in the entire adhesive film 10 may be greater than the content of the first core shell particles 120 in the entire adhesive film 10.

As described above, the adhesive film 10 includes the first bonding layer 100 having the first core shell particles 120 and can thus absorb a deformation force generated by the moisture absorbent 130. As a result, the surface deformation of the first bonding layer 100 can be prevented, and the WVTR characteristics of the adhesive film 10 can be improved by injecting a relatively large amount of the moisture absorbent 130. Also, since the second core shell particles 220 are contained in the second bonding layer 200, the high-temperature heat resistance of the adhesive film 10 can be improved. Also, since the second core shell particles 220 can perform a moisture absorption function, the WVTR characteristics of the adhesive film 10 can be further improved.

Adhesive films according to other exemplary embodiments of the present disclosure will hereinafter be described.

Figure 5:
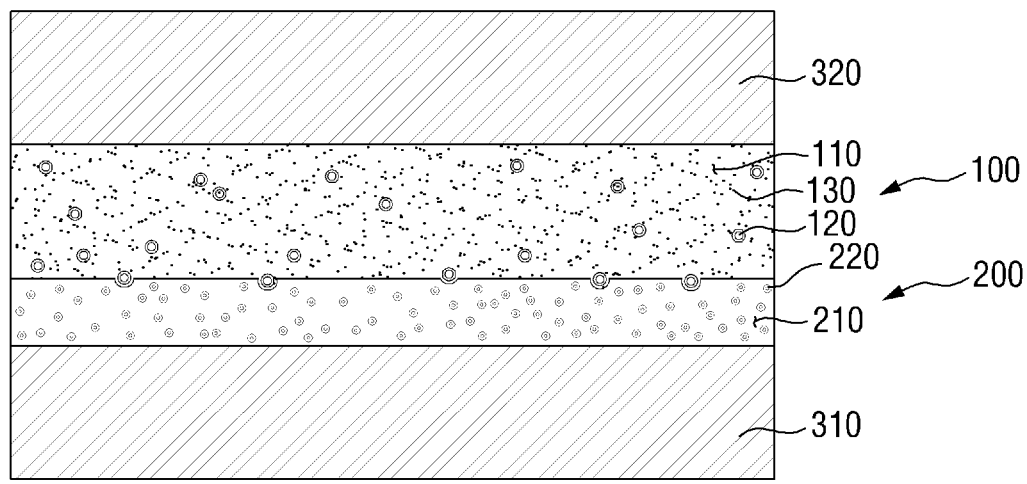
FIG. 5 is a cross-sectional view of an adhesive film according to another exemplary embodiment of the present disclosure.

FIG. 5 is a cross-sectional view of an adhesive film according to another exemplary embodiment of the present disclosure.

Referring to FIG. 5, in an adhesive film 11, unlike in the adhesive film 10 of FIG. 1, a first base 320 is disposed on the top surface of a first bonding layer 100, and a second base 310 is disposed on the bottom surface of a second bonding layer 200.

Specifically, the first and second bases 320 and 310 may be release films. That is, the first and second bases 320 and 310 are for protecting the first and second bonding layers 100 and 200, respectively, and may be removed when the adhesive film 11 is used. The thickness of the second base 310 may be greater than the thickness of the first base 320, but the present disclosure is not limited thereto.

Typical polymer films may be used as the first and second bases 320 and 310. The first and second bases 320 and 310 may be polyethylene terephthalate (PET) films, polytetrafluoroethylene films, polyethylene films, polypropylene films, polybutene films, polybutadiene films, vinyl chloride copolymer films, ethylene-vinyl acetate films, ethylene-propylene copolymer films, ethylene-ethyl acrylate copolymer films, ethylene-methyl acrylate copolymer films, or polyimide films. One or both surfaces of each of the first base material 320 and the second base material 310 may have been subjected to a release treatment process. Examples of a release agent used in the release treatment process include an alkyd-based release agent, a silicone-based release agent, a fluorine-based release agent, an unsaturated ester-based release agent, a polyolefin-based release agent, and a wax-based release agent. In view of heat resistance, an alkyd-based release agent, a silicone-based release agent, or a fluorine-based release agent may preferably be used as the release agent, but the present disclosure is not limited thereto.

In one exemplary embodiment, the first base 320 may comprise light-release silicone PET, and the second substrate 310 may comprise low-transfer heavy-release silicone PET. That is, the first base 320 can be peeled off more easily than the second base 310. In an encapsulation process for an organic electronic device, the first base 320 may be peeled off first from the first bonding layer 100, and then the first bonding layer 100 may be attached to a cover base, in which case, the second base 310 may preferably remain attached on the second bonding layer 200. Thus, if a heavy-release PET film that is relatively difficult to peel off is used as the second base 310, the second base 310 can remain attached on the second bonding layer 200 even when the first base 320 is peeled off from the first bonding layer 100.

In the case of using a PET release film to which a silicone release agent is applied, the silicone from the release agent may be released into an adhesive, and the stronger the peeling force of the PET release film, the greater the amount of silicone transferred from the PET release film. Once the silicone is transferred, the adhesive force of the PET release film may decrease. Since the first base 320 is a light-release release PET film, the influence of the first base 320 is relatively insignificant. However, since a heavy-release silicone PET film is used as the second base 310, silicone is highly likely to be transferred from the second base 310 to the second bonding layer 200. To prevent this, the second base 310 may preferably have a low-transfer characteristic. Therefore, a silicone PET release film having low-transfer heavy-release characteristics may be used as the second base 310.

Figure 6:
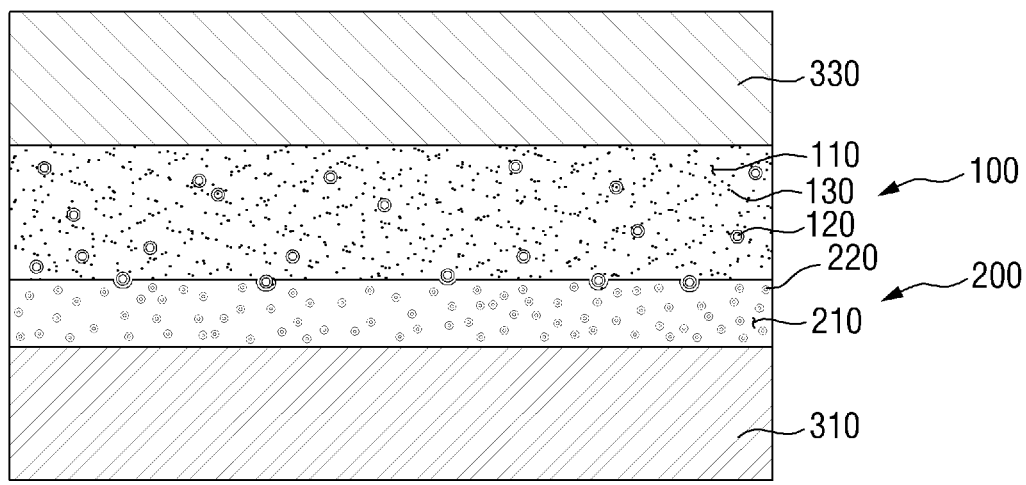
FIG. 6 is a cross-sectional view of an adhesive film according to another exemplary embodiment of the present disclosure.

FIG. 6 is a cross-sectional view of an adhesive film according to another exemplary embodiment of the present disclosure.

Referring to FIG. 6, in an adhesive film 12, unlike in the adhesive film 11 of FIG. 5, a cover substrate 330 is provided instead of the first base 320.

The cover substrate 330 may be formed of glass or a polymer film or may comprise a metal. When the cover substrate 330 comprises a metal, the cover substrate 330 can reflect light incident thereupon toward the rear thereof, and the heat dissipation characteristics of an OLED display device to which the adhesive film 12 is applied can be improved.

Examples of the metal used to form the cover substrate 330 include nickel, a nickel alloy, stainless steel (SUS), aluminum, an aluminum alloy, copper, and a copper alloy, but the present disclosure is not limited thereto.

The adhesive film 12 may be used to encapsulate the organic material of an OLED display device. An organic electronic device according to an exemplary embodiment of the present disclosure will hereinafter be described taking an OLED display device.

Figure 7:
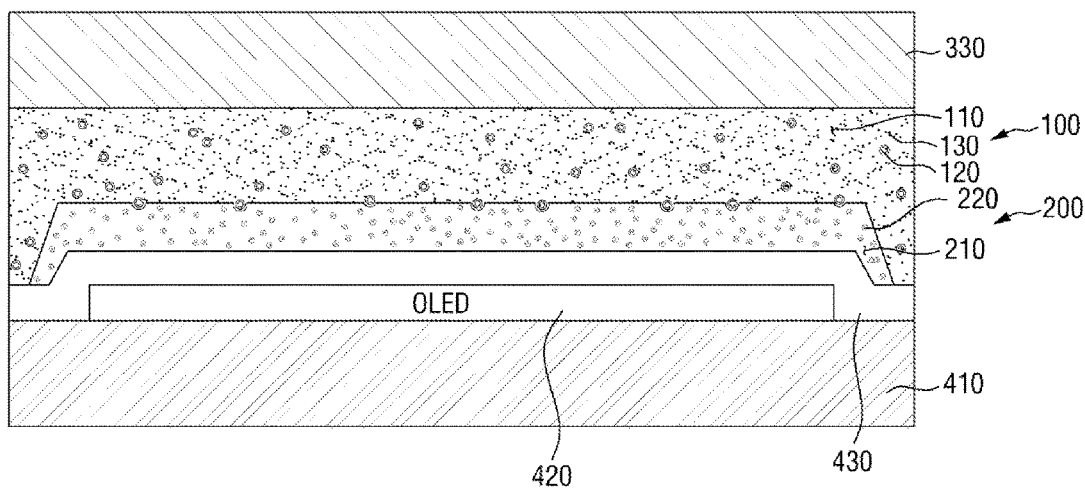
FIG. 7 is a cross-sectional view of an organic light-emitting diode (OLED) display device according to an exemplary embodiment of the present disclosure.

FIG. 7 is a cross-sectional view of an OLED display device according to an exemplary embodiment of the present disclosure, which employs an adhesive film according to an exemplary embodiment of the present disclosure.

Referring to FIG. 7, an OLED display device 50 includes a base substrate 410, an OLED 420 disposed on the base substrate 410, a passivation layer 430 disposed on the OLED 420, and an adhesive film disposed on the passivation layer 430.

The base substrate 410 may be formed of a transparent material. For example, the base substrate 410 may be formed of glass, plastic, or a polymer resin.

The OLED 420 is disposed on the base substrate 410. The OLED 420 includes an anode electrode, a cathode electrode, and an organic light-emitting layer disposed between the anode electrode and the cathode electrode. The organic light-emitting layer emits light of a particular wavelength depending on a current applied thereto. Although not specifically illustrated, a plurality of thin-film transistors (TFTs) and signal wires, which control a current flowing into the OLED 420, may be further provided on the OLED 420. A color filter may be disposed between the base substrate 410 and the OLED 420.

The passivation layer 430 may be disposed to cover the OLED 420. The passivation layer 430 may be formed as an inorganic film or a stack of an organic film and an inorganic film. The passivation layer 430 may have a WVTR of about 10-6 g/m2/day, but the present disclosure is not limited thereto.

An adhesive film is disposed on the passivation layer 430. The adhesive film includes a first bonding layer 100, a second bonding layer 200, and a cover substrate 330. When the OLED display device 50 is a bottom emission display device, the cover substrate 330 may be formed of a metal. On the other hand, when the OLED display device 50 is a top emission display device or a both-side emission display device, the cover substrate 330 may be formed of a transparent material. The cover substrate 330 may not be provided. Adhesive films according to some exemplary embodiments of the present disclosure and variations thereof are applicable to the OLED display device 50.

In the OLED display device 50, the adhesive film 10 may be provided on the passivation layer 430. Thus, the infiltration of moisture into the OLED 420 can be prevented or at least suppressed. Also, since the first core shell particles 120 are disposed in the first bonding layer 100 of the adhesive film 10, a deformation force generated by the moisture absorbent 130 can be absorbed, the surface deformation of the first bonding layer 100 can be prevented, a relatively large amount of moisture absorbent 130 can be injected into the adhesive film 10, and as a result, the WVTR characteristics of the adhesive film 10 can be improved. Also, since the second core shell particles 220 are disposed in the second bonding layer 200 of the adhesive film 10, the high-temperature heat resistance of the of the adhesive film 10 can be improved, the second core shell particles 220 can perform a moisture absorption function, and as a result, the WVTR characteristics of the adhesive film 10 can be further improved.

Exemplary embodiments of the present disclosure will hereinafter be described in further detail, taking various preparation examples and experimental examples.

Preparation Example 1

To prepare a first bonding layer, 12 wt % of polyisobutylene (B100, Basf) (containing 7 wt % of butyl rubber (268, Exxon) as a compatibilizing agent) as a binder, 24 wt % of a hydrocarbon resin (SU-640, Kolon Industries) as a tackifier, 0.5 wt % of first core shell particles (461 DET 20D40, Expancel) having an outer diameter of 20 µm, 3 wt % of an acrylic oligomer (BNO-2.0H, BNTM), 31 wt % of a moisture absorbent (CaO, Daejung Chemicals), and 0.5 wt % of a photoinitiator (TPO, Irgacure) were added to 29 wt % of toluene, a solvent, and were mixed by a disk-type stirrer for two hours. Then, the mixture was applied to a silicone PET release film (SG-31, SKC) having a thickness of 36 µm, with the use of a slot die coater, and was dried with hot air at a temperature of 125° C., thereby obtaining a first bonding layer having a thickness of 40 µm.

To prepare a second bonding layer, 12 wt % of polyisobutylene (B15FN, Basf) (containing 7 wt % of butyl rubber (268, Exxon) as a compatibilizing agent) as a binder, 21 wt % of a hydrocarbon resin (SU-90, Kolon Industries) as a tackifier, 2 wt % of an acrylic oligomer (BNO-2.0H, BNTM), 0.5 wt % of a photoinitiator (TPO, Irgacure), and 11.5 wt % of second core shell particles (SX866, JSR) having an outer diameter of 300 nm were added to 53 wt % of toluene, a solvent, and were mixed by a disk-type stirrer for two hours. Then, the mixture was applied to a low-transfer heavy-release silicone PET film (RT42L, SKCHAAS) having a thickness of 50 µm, with the use of a slot die coater, and was dried with hot air at a temperature of 125° C., thereby obtaining a second bonding layer having a thickness of 10 µm.

The prepared first and second bonding layers were laminated using a 70° C. Lami roll, and were irradiated with 1,000 mJ of ultraviolet (UV) light, thereby obtaining an adhesive film according to Preparation Example 1.

Preparation Examples 2 Through 20

Adhesive films according to Preparation Examples 2 through 20 were fabricated in the same manner as the adhesive film according to Preparation Example 1, but using different sizes and contents of first core shell particles and second core shell particles from the adhesive film according to Preparation Example 1, as shown in Table 1 below.

TABLE 1

| | First Core Shell Particles | | Second Core Shell Particles | |
|---|---|---|---|---|
| | Size (µm) | Content (wt %) | Size (nm) | Content (wt %) |
| Preparation Example 1 | 20 | 0.5 | 300 | 10 |
| Preparation Example 2 | 20 | 0.2 | 300 | 10 |
| Preparation Example 3 | 20 | 1.0 | 300 | 10 |
| Preparation Example 4 | 20 | 2.0 | 300 | 10 |
| Preparation Example 5 | 20 | 3.0 | 300 | 10 |
| Preparation Example 6 | 40 | 0.5 | 300 | 10 |
| Preparation Example 7 | 40 | 0.2 | 300 | 10 |
| Preparation Example 8 | 40 | 1.0 | 300 | 10 |
| Preparation Example 9 | 40 | 2.0 | 300 | 10 |
| Preparation Example 10 | 40 | 3.0 | 300 | 10 |
| Preparation Example 11 | 20 | 0.5 | 300 | 2 |
| Preparation Example 12 | 20 | 0.5 | 300 | 5 |

TABLE 1-continued

|  | First Core Shell Particles | | Second Core Shell Particles | |
| --- | --- | --- | --- | --- |
|  | Size (μm) | Content (wt %) | Size (nm) | Content (wt %) |
| Preparation Example 13 | 20 | 0.5 | 300 | 15 |
| Preparation Example 14 | 20 | 0.5 | 300 | 20 |
| Preparation Example 15 | 20 | 0.5 | 500 | 2 |
| Preparation Example 16 | 20 | 0.5 | 500 | 5 |
| Preparation Example 17 | 20 | 0.5 | 500 | 10 |
| Preparation Example 18 | 20 | 0.5 | 500 | 15 |
| Preparation Example 19 | 20 | 0.5 | 500 | 20 |

Comparative Examples 1 Through 8

Adhesive films according to Comparative Examples 1 through 8 were fabricated in the same manner as the adhesive film according to Preparation Example 1, except for whether the first core shell particles and/or the second core shell particles were added and which types of first core shell particles and/or second core shell particles were added.

TABLE 2

|  | First Core Shell Particles | Second Core Shell Particles |
| --- | --- | --- |
| Comparative Example 1 | Not Added | Conventional Type |
| Comparative Example 2 | CaCO$_3$ Non-Coating | Conventional Type |
| Comparative Example 3 | Inorganic Foamed Particles | Conventional Type |
| Comparative Example 4 | Urethane Rubber Shell | Conventional Type |
| Comparative Example 5 | Hollow Styrene Beads | Conventional Type |
| Comparative Example 6 | Not Added | Not Added |
| Comparative Example 7 | Conventional Type | Hollow Silica Particles |
| Comparative Example 8 | Conventional Type | Teflon Particles |

<Experimental Example 1> Water Transmission Testing (1)

The adhesive films according to Preparation Examples 1 through 19 and Comparative Examples 1 through 8 were cut into a size of 90 mm×90 mm, and the release films on the first bonding layers of the adhesive films were removed. The first bonding layers of the adhesive films were arranged on a cleaned 0.7 T×100 mm×100 mm alkali-free glass plate to be centered and were laminated with a 65° C. roll laminator. The release films on the second bonding layers of the adhesive films were removed, and the adhesive films were covered with a new 0.7 T×100 mm×100 mm alkali-free glass plate and were laminated by applying pressure for five minutes with a 65° C. vacuum laminator. Then, the adhesive films were aged in a 100° C. convection oven for about one hour and were observed in a reliable chamber (set at a temperature of 85° C./a humidity of 85%) for 1,000 hours at a temporal interval of 100 hours, for moisture penetration length, using a ×50 digital microscope. Moisture penetration length was measured by measuring the maximum penetration length of moisture into each of the four sides of a rectangular glass plate and averaging the results of the measurement.

<Experimental Example 2> Volume Expansion Testing

The adhesive films according to Preparation Examples 1 through 19 and Comparative Examples 1 through 8 were cut into a size of 80 mm×80 mm, and the release films on the first bonding layers of the adhesive films were removed. Then, the adhesive films were laminated on a cleaned 80 μm metal (Alloy 36) with a 65° C. roll laminator and were cut into a size of 50 mm×50 mm. The release films on the second bonding layers of the adhesive films were arranged on a 0.7 T×100 mm×100 mm alkali-free glass to be centered and were laminated by applying pressure for five minutes with a 65° C. vacuum laminator. Then, the adhesive films were aged in a 100° C. convection oven for about one hour and were observed in a reliable chamber (set at a temperature of 85° C./a humidity of 85%) at a temporal interval of 100 hours for the volume expansion of parts penetrated by moisture. Adhesive films having the metal swell to a height of less than 1 μm were evaluated as "Very Excellent," adhesive films having the metal swell to 1 μm to 5 μm were evaluated as "Excellent," and adhesive films having the metal swell to 5 μm or greater were evaluated as "Poor."

<Experimental Example 3> High-Temperature Heat Resistance Testing

The release films on the first bonding layers of the adhesive films according to Preparation Examples 1 through 19 and Comparative Examples 1 through 8 were removed, and the adhesive films were laminated on a cleaned 80 μm metal with a 65° C. roll laminator and were cut into a size of 25 mm×80 mm. Then, then release films on the second bonding layers of the adhesive films were removed, and the adhesive films were arranged on a 0.7 T×100 mm×100 mm alkali-free glass to be left- and right-aligned, centered, and aligned with a 20 mm part from the bottom of the glass, and were laminated by applying pressure for five minutes with a 65° C. vacuum laminator. Then, the adhesive films were aged in a 100° C. convection oven for about one hour. Then, the glass with the adhesive films attached thereto was hung so that the adhesive films could receive the load of the glass, and the adhesive films were observed for 72 hours for the degree to which their bonding layers flowed down. Adhesive films with bonding layers flown down by less than 100 μm were evaluated as "Excellent," and adhesive films with bonding layers flown down by 100 μm or more were evaluated as "Poor."

<Experimental Example 4> Metal Adhesion Testing

The release films on the first bonding layers of the adhesive films according to Preparation Examples 1 through 19 and Comparative Examples 1 through 8 were removed, and the adhesive films were laminated on a cleaned 80 μm metal with a 65° C. roll laminator. Then, the release films on the second bonding layers of the adhesive films were removed, and a Nitto 31B tape was hand-laminated on the adhesive films without bubbles. Then, the adhesive films were aged in a 100° C. convection oven for about one hour and were cut into a size of 25 mm×120 mm, and the metal surfaces of the adhesive films were attached on a SUS plate for adhesion testing. Then, the adhesive powers of the adhesive films were measured by performing a 180° peel test using a universal testing machine (UTM). Adhesive films having an adhesive power of 700 g/25 mm or greater were evaluated as "Excellent," and adhesive films having an adhesive power of 700 g/25 mm or less were evaluated as "Poor."

<Experimental Example 5> Release Film Peeling Force Testing

The release films on the first bonding layers of the adhesive films according to Preparation Examples 1 through 19 and Comparative Examples 1 through 8 were remove, a Nitto 31B tape was hand-laminated on the adhesive films without bubbles, and the adhesive films were cut into a size of 25 mm×120 mm. Then, the release films on the second bonding layers of the adhesive films were fixed on a SUS plate using a double-sided tape, and the peeling powers of the release films of the adhesive films were measured by performing a 180° peel test using a UTM. Adhesive films having a peeling power of 14 g/25 mm to 22 g/25 mm were evaluated as "Very Excellent," adhesive films having a peeling power of 8 g/25 mm to 14 g/25 mm were evaluated as "Excellent," and adhesive films having a peeling power of 8 g/25 mm or less, or 22 g/25 mm or greater, were evaluated as "Poor."

The results of Experimental Examples 1 through 5 are as shown in Table 3 below.

TABLE 3

| | Moisture Penetration (mm) | Volume Expansion | High-Temperature Heat Resistance | Metal Adhesion | Release Film Peeling Force |
|---|---|---|---|---|---|
| Preparation Example 1 | 1.5 | Very Excellent | Excellent | Excellent | Very Excellent |
| Preparation Example 2 | 1.4 | Very Excellent | Excellent | Excellent | Very Excellent |
| Preparation Example 3 | 1.6 | Very Excellent | Excellent | Excellent | Very Excellent |
| Preparation Example 4 | 1.7 | Very Excellent | Excellent | Poor | Very Excellent |
| Preparation Example 5 | 2.0 | Very Excellent | Excellent | Poor | Very Excellent |
| Preparation Example 6 | 1.5 | Very Excellent | Excellent | Excellent | Very Excellent |
| Preparation Example 7 | 1.5 | Very Excellent | Excellent | Excellent | Very Excellent |
| Preparation Example 8 | 1.8 | Very Excellent | Excellent | Excellent | Very Excellent |
| Preparation Example 9 | 1.8 | Very Excellent | Excellent | Poor | Very Excellent |
| Preparation Example 10 | 2.0 | Very Excellent | Excellent | Poor | Very Excellent |
| Preparation Example 11 | 1.5 | Very Excellent | Poor | Excellent | Poor |
| Preparation Example 12 | 1.5 | Very Excellent | Excellent | Excellent | Excellent |
| Preparation Example 13 | 1.6 | Very Excellent | Excellent | Excellent | Very Excellent |
| Preparation Example 14 | 1.8 | Very Excellent | Poor | Excellent | Excellent |
| Preparation Example 15 | 1.5 | Very Excellent | Poor | Excellent | Excellent |
| Preparation Example 16 | 1.5 | Very Excellent | Excellent | Excellent | Very Excellent |
| Preparation Example 17 | 1.5 | Very Excellent | Excellent | Excellent | Very Excellent |
| Preparation Example 18 | 1.8 | Very Excellent | Excellent | Excellent | Excellent |
| Preparation Example 19 | 2.0 | Very Excellent | Poor | Excellent | Excellent |
| Comparative Example 1 | 2.2 | Poor | Excellent | Poor | Very Excellent |
| Comparative Example 2 | 1.7 | Very Excellent | Excellent | Poor | Very Excellent |
| Comparative Example 3 | 2.5 | Poor | Excellent | Poor | Very Excellent |
| Comparative Example 4 | 2.8 | Excellent | Excellent | Excellent | Very Excellent |
| Comparative Example 5 | 2.2 | Poor | Excellent | Poor | Very Excellent |
| Comparative Example 6 | 2.3 | Poor | Poor | Poor | Poor |
| Comparative Example 7 | 1.8 | Very Excellent | Excellent | Excellent | Excellent |
| Comparative Example 8 | 3.0 | Very Excellent | Excellent | Excellent | Excellent |

Preparation Example 20

To prepare a first bonding layer, a moisture absorbent (CaO, Daejung Chemicals), first core shell particles (461 DET 20D40, Expancel) having an outer diameter of 20 μm and a density of 0.025 g/cm$^3$, and toluene were added to a first bonding component material (100 wt %) comprising 26 wt % of polyisobutylene (B100, Basf) as a binder, 15 wt % of butyl rubber (268, Exxon) as a compatibilizing agent, 52 wt % of a hydrocarbon resin (SU-640, Kolon Industries) as a tackifier, 6 wt % of an acrylic oligomer (BNO-2.0H, BNTM), and 1 wt % of a photoinitiator (TPO, Irgacure). The content of the moisture absorbent was 80% by weight of the first bonding component material, and the content of the first core shell particles was 0.2% by weight of the first bonding component material. The content of toluene was 50% by weight of the mixture of the first bonding component material, the moisture absorbent, and the first core shell particles. Then, all the above ingredients were stirred and mixed by a disk-type stirrer for two hours. Then, the mixture was applied to a silicone PET release film (SG-31, SKC) having a thickness of 36 μm, with the use of a slot die coater, and was dried with hot air at a temperature of 125° C., thereby obtaining a first bonding layer having a thickness of 40 μm.

To prepare a second bonding layer, 8 wt % of polyisobutylene (B15FN, Basf) as a binder, 15 wt % of butyl rubber (268, Exxon) as a compatibilizing agent, 58 wt % of a hydrocarbon resin (SU-90, Kolon Industries) as a tackifier, 8 wt % of an acrylic oligomer (BNO-2.0H, BNTM), 1 wt % of a photoinitiator (TPO, Irgacure), and 10 wt % of second core shell particles (SX866, JSR) having an outer diameter of 300 nm were added, and toluene was added as a solvent in an amount of 50% by weight of all the ingredients already added. Then, these ingredients were mixed by a disk-type stirrer for two hours. Then, the mixture was applied to a low-transfer heavy-release silicone PET film (RT42L, SKCHAAS) having a thickness of 50 μm, with the use of a slot die coater, and was dried with hot air at a temperature of 125° C., thereby obtaining a second bonding layer having a thickness of 10 μm.

The prepared first and second bonding layers were laminated using a 70° C. Lami roll, and were irradiated with 1,000 mJ of UV light, thereby obtaining an adhesive film according to Preparation Example 20.

Preparation Examples 21 Through 26

Adhesive films according to Preparation Examples 21 through 26 were fabricated in the same manner as the adhesive film according to Preparation Example 20, except that the content of the moisture absorbent in the first bonding layer was changed to 90 wt %, 100 wt %, 110 wt %, 120 wt %, 130 wt %, or 140 wt %.

Preparation Examples 27 Through 33

Adhesive films according to Preparation Examples 27 through 33 were fabricated in the same manner as the adhesive film according to Preparation Example 20, except that the first core shell particles were added in an amount of 0.5% by weight of the first bonding component material, and that the content of the moisture absorbent in the first bonding layer was changed to 80 wt %, 90 wt %, 100 wt %, 110 wt %, 120 wt %, 130 wt %, or 140 wt %.

Preparation Examples 34 Through 40

Adhesive films according to Preparation Examples 34 through 40 were fabricated in the same manner as the adhesive film according to Preparation Example 20, except that the first core shell particles were added in an amount of 0.8% by weight of the first bonding component material, and that the content of the moisture absorbent in the first bonding layer was changed to 80 wt %, 90 wt %, 100 wt %, 110 wt %, 120 wt %, 130 wt %, or 140 wt %.

Preparation Examples 41 Through 47

Adhesive films according to Preparation Examples 41 through 47 were fabricated in the same manner as the adhesive film according to Preparation Example 20, except that the first core shell particles were added in an amount of 1.0% by weight of the first bonding component material, and that the content of the moisture absorbent in the first bonding layer was changed to 80 wt %, 90 wt %, 100 wt %, 110 wt %, 120 wt %, 130 wt %, or 140 wt %.

Preparation Examples 48 Through 54

Adhesive films according to Preparation Examples 48 through 54 were fabricated in the same manner as the adhesive film according to Preparation Example 20, except that the first core shell particles were added in an amount of 1.5% by weight of the first bonding component material, and that the content of the moisture absorbent in the first bonding layer was changed to 80 wt %, 90 wt %, 100 wt %, 110 wt %, 120 wt %, 130 wt %, or 140 wt %.

Preparation Examples 55 Through 61

Adhesive films according to Preparation Examples 55 through 61 were fabricated in the same manner as the adhesive film according to Preparation Example 20, except that the first core shell particles were added in an amount of 2.0% by weight of the first bonding component material, and that the content of the moisture absorbent in the first bonding layer was changed to 80 wt %, 90 wt %, 100 wt %, 110 wt %, 120 wt %, 130 wt %, or 140 wt %.

Comparative Examples 9 Through 15

Adhesive films according to Comparative Examples 9 through 15 were fabricated in the same manner as the adhesive film according to Preparation Example 20, except that the first core shell particles were not added (i.e., the content of the first core shell particles: 0 wt %), and that the content of the moisture absorbent in the first bonding layer was changed to 80 wt %, 90 wt %, 100 wt %, 110 wt %, 120 wt %, 130 wt %, or 140 wt %.

The content ratios of the first bonding layers of the adhesive films according to Preparation Examples 20 through 61 and Comparative Examples 9 through 15 are as shown in Table 4 below. In Table 4, "MX" denotes the first bonding component material, "AB" denotes the moisture absorbent, and "CS" denotes the first core shell particles. Also, in Table 4, "Content Relative to MX" shows the contents (wt %) of the moisture absorbent and the first core shell particles relative to the weight of the first bonding component material of the first bonding layer, "Content Ratio Relative to First Bonding Layer" shows the ratio of the content of each of the moisture absorbent, the first bonding component material, and the first core shell particles to the entire composition of the first bonding layer, and "Volume Ratio Relative to First Bonding Layer" shows the ratio of the volume of each of the moisture absorbent, the first bonding component material, and the first core shell particles to the volume of the first bonding layer.

TABLE 4

|  | Content Relative to MX | | Content Ratio Relative to First Bonding Layer | | | Volume Ratio Relative to First Bonding Layer | | |
| --- | --- | --- | --- | --- | --- | --- | --- | --- |
|  | AB | CS | AB | MX | CS | AB | MX | CS |
| Preparation Example 20 | 80 | 0.2 | 0.4440 | 0.5549 | 0.0011 | 0.1325 | 0.6606 | 0.0444 |
| Preparation Example 21 | 90 | 0.2 | 0.4732 | 0.5258 | 0.0011 | 0.1412 | 0.6259 | 0.0421 |
| Preparation Example 22 | 100 | 0.2 | 0.4995 | 0.4995 | 0.0010 | 0.1491 | 0.5946 | 0.0400 |
| Preparation Example 23 | 110 | 0.2 | 0.5233 | 0.4757 | 0.0010 | 0.1562 | 0.5664 | 0.0381 |
| Preparation Example 24 | 120 | 0.2 | 0.5450 | 0.4541 | 0.0009 | 0.1627 | 0.5406 | 0.0363 |
| Preparation Example 25 | 130 | 0.2 | 0.5647 | 0.4344 | 0.0009 | 0.1686 | 0.5171 | 0.0348 |
| Preparation Example 26 | 140 | 0.2 | 0.5828 | 0.4163 | 0.0008 | 0.1740 | 0.4956 | 0.0333 |
| Preparation Example 27 | 80 | 0.5 | 0.4432 | 0.5540 | 0.0028 | 0.1323 | 0.6595 | 0.1108 |
| Preparation Example 28 | 90 | 0.5 | 0.4724 | 0.5249 | 0.0026 | 0.1410 | 0.6249 | 0.1050 |
| Preparation Example 29 | 100 | 0.5 | 0.4988 | 0.4988 | 0.0025 | 0.1489 | 0.5938 | 0.0998 |
| Preparation Example 30 | 110 | 0.5 | 0.5226 | 0.4751 | 0.0024 | 0.1560 | 0.5655 | 0.0950 |
| Preparation Example 31 | 120 | 0.5 | 0.5442 | 0.4535 | 0.0023 | 0.1625 | 0.5399 | 0.0907 |
| Preparation Example 32 | 130 | 0.5 | 0.5640 | 0.4338 | 0.0022 | 0.1684 | 0.5165 | 0.0868 |
| Preparation Example 33 | 140 | 0.5 | 0.5821 | 0.4158 | 0.0021 | 0.1738 | 0.4950 | 0.0832 |
| Preparation Example 34 | 80 | 0.8 | 0.4425 | 0.5531 | 0.0044 | 0.1321 | 0.6584 | 0.1770 |
| Preparation Example 35 | 90 | 0.8 | 0.4717 | 0.5241 | 0.0042 | 0.1408 | 0.6239 | 0.1677 |
| Preparation Example 36 | 100 | 0.8 | 0.4980 | 0.4980 | 0.0040 | 0.1487 | 0.5929 | 0.1594 |
| Preparation Example 37 | 110 | 0.8 | 0.5218 | 0.4744 | 0.0038 | 0.1558 | 0.5647 | 0.1518 |
| Preparation Example 38 | 120 | 0.8 | 0.5435 | 0.4529 | 0.0036 | 0.1622 | 0.5392 | 0.1449 |
| Preparation Example 39 | 130 | 0.8 | 0.5633 | 0.4333 | 0.0035 | 0.1681 | 0.5158 | 0.1386 |
| Preparation Example 40 | 140 | 0.8 | 0.5814 | 0.4153 | 0.0033 | 0.1736 | 0.4944 | 0.1329 |
| Preparation Example 41 | 80 | 1.0 | 0.4420 | 0.5525 | 0.0055 | 0.1319 | 0.6577 | 0.2210 |
| Preparation Example 42 | 90 | 1.0 | 0.4712 | 0.5236 | 0.0052 | 0.1407 | 0.6233 | 0.2094 |
| Preparation Example 43 | 100 | 1.0 | 0.4975 | 0.4975 | 0.0050 | 0.1485 | 0.5923 | 0.1990 |
| Preparation Example 44 | 110 | 1.0 | 0.5213 | 0.4739 | 0.0047 | 0.1556 | 0.5642 | 0.1896 |
| Preparation Example 45 | 120 | 1.0 | 0.5430 | 0.4525 | 0.0045 | 0.1621 | 0.5387 | 0.1810 |
| Preparation Example 46 | 130 | 1.0 | 0.5628 | 0.4329 | 0.0043 | 0.1680 | 0.5154 | 0.1732 |
| Preparation Example 47 | 140 | 1.0 | 0.5809 | 0.4149 | 0.0041 | 0.1734 | 0.4940 | 0.1660 |
| Preparation Example 48 | 80 | 1.5 | 0.4408 | 0.5510 | 0.0083 | 0.1316 | 0.6559 | 0.3306 |
| Preparation Example 49 | 90 | 1.5 | 0.4700 | 0.5222 | 0.0078 | 0.1403 | 0.6217 | 0.3133 |
| Preparation Example 50 | 100 | 1.5 | 0.4963 | 0.4963 | 0.0074 | 0.1481 | 0.5908 | 0.2978 |
| Preparation Example 51 | 110 | 1.5 | 0.5201 | 0.4728 | 0.0071 | 0.1553 | 0.5629 | 0.2837 |
| Preparation Example 52 | 120 | 1.5 | 0.5418 | 0.4515 | 0.0068 | 0.1617 | 0.5375 | 0.2709 |
| Preparation Example 53 | 130 | 1.5 | 0.5616 | 0.4320 | 0.0065 | 0.1676 | 0.5142 | 0.2592 |

TABLE 4-continued

| | Content Relative to MX | | Content Ratio Relative to First Bonding Layer | | | Volume Ratio Relative to First Bonding Layer | | |
|---|---|---|---|---|---|---|---|---|
| | AB | CS | AB | MX | CS | AB | MX | CS |
| Preparation Example 54 | 140 | 1.5 | 0.5797 | 0.4141 | 0.0062 | 0.1730 | 0.4930 | 0.2484 |
| Preparation Example 55 | 80 | 2.0 | 0.4396 | 0.5495 | 0.0110 | 0.1312 | 0.6541 | 0.4396 |
| Preparation Example 56 | 90 | 2.0 | 0.4688 | 0.5208 | 0.0104 | 0.1399 | 0.6200 | 0.4167 |
| Preparation Example 57 | 100 | 2.0 | 0.4950 | 0.4950 | 0.0099 | 0.1478 | 0.5893 | 0.3960 |
| Preparation Example 58 | 110 | 2.0 | 0.5189 | 0.4717 | 0.0094 | 0.1549 | 0.5615 | 0.3774 |
| Preparation Example 59 | 120 | 2.0 | 0.5405 | 0.4505 | 0.0090 | 0.1614 | 0.5363 | 0.3604 |
| Preparation Example 60 | 130 | 2.0 | 0.5603 | 0.4310 | 0.0086 | 0.1673 | 0.5131 | 0.3448 |
| Preparation Example 61 | 140 | 2.0 | 0.5785 | 0.4132 | 0.0083 | 0.1727 | 0.4919 | 0.3306 |
| Comparative Example 9 | 80 | 0 | 0.4444 | 0.5556 | 0.0000 | 0.1327 | 0.6614 | 0.0000 |
| Comparative Example 10 | 90 | 0 | 0.4737 | 0.5263 | 0.0000 | 0.1414 | 0.6266 | 0.0000 |
| Comparative Example 11 | 100 | 0 | 0.5000 | 0.5000 | 0.0000 | 0.1493 | 0.5952 | 0.0000 |
| Comparative Example 12 | 110 | 0 | 0.5238 | 0.4762 | 0.0000 | 0.1564 | 0.5669 | 0.0000 |
| Comparative Example 13 | 120 | 0 | 0.5455 | 0.4545 | 0.0000 | 0.1628 | 0.5411 | 0.0000 |
| Comparative Example 14 | 130 | 0 | 0.5652 | 0.4348 | 0.0000 | 0.1687 | 0.5176 | 0.0000 |
| Comparative Example 15 | 140 | 0 | 0.5833 | 0.4167 | 0.0000 | 0.1741 | 0.4960 | 0.0000 |

Experimental Example 6 Water Transmission Testing (2)

The adhesive films according to Preparation Examples 20 through 61 and Comparative Examples 9 through 15 were cut into a size of 90 mm×90 mm, and the release films on the first bonding layers of the adhesive films were removed. The first bonding layers of the adhesive films were arranged on a cleaned 0.7 T×100 mm×100 mm alkali-free glass to be centered and were laminated with a 65° C. roll laminator. The release films on the second bonding layers of the adhesive films were removed, and the adhesive films were covered with a new 0.7 T×100 mm×100 mm alkali-free glass and were laminated by applying pressure for five minutes with a 65° C. vacuum laminator. Then, the adhesive films were aged in a 100° C. convection oven for about one hour and were observed in a reliable chamber (set at a temperature of 85° C./a humidity of 85%) for 1,000 hours at a temporal interval of 100 hours, for moisture penetration length, using a ×50 digital microscope. Moisture penetration length was measured by measuring maximum moisture penetration length from each of the four sides of a rectangular glass plate and averaging the maximum moisture penetration length measurements. Adhesive films with first bonding layers damaged, or with pores formed in the first bonding layers, due to the first bonding layers expanding too excessively in the process of absorbing moisture, were evaluated as "cracking."

Experimental Example 7 Metal Adhesion Testing (2)

The release films on the first bonding layers of the adhesive films according to Preparation Examples 20 through 61 and Comparative Examples 9 through 15 were removed, and the adhesive films were laminated on a cleaned 80 μm metal (Alloy 36) with a 65° C. roll laminator. Then, the release films on the second bonding layers of the adhesive films were removed, and a Nitto 31B tape was hand-laminated on the adhesive films without bubbles. Then, the adhesive films were aged in a 100° C. convection oven for about one hour and were cut into a size of 25 mm×120 mm, and the metal surfaces of the adhesive films were attached on a SUS plate for adhesion testing. Then, the adhesive powers of the adhesive films were measured by performing a 180° peel test using a UTM. Adhesive films having an adhesive power of 700 g/25 mm or greater were evaluated as "Excellent," and adhesive films having an adhesive power of 700 g/25 mm or less were evaluated as "Poor."

The results of Experimental Examples 6 and 7 are as shown in Table 5 below.

TABLE 5

| Preparation Examples 20-61 & Comparative Examples 9-15 | | | Content of First Core Shell Particles (wt %) | | | | | | |
|---|---|---|---|---|---|---|---|---|---|
| | | | 0 | 0.2 | 0.5 | 0.8 | 1 | 1.5 | 2 |
| Content of Moisture Absorbent (wt %) | 80 | Moisture Penetration (mm) | 1.75 | 1.8 | 1.93 | 1.96 | 2.09 | 2.34 | 2.35 |
| | | Volume Expansion Rate (%) | 116 | 109.8 | 101.7 | 94.7 | 90.6 | 81.7 | 74.3 |
| | | MX Volume Ratio (wt %) | 83.3 | 78.9 | 73.1 | 68.1 | 65.1 | 58.7 | 53.4 |
| | | Metal Adhesion | Very Excellent | Very Excellent | Excellent | Excellent | Excellent | Poor | Poor |
| | 90 | Moisture Penetration (mm) | 1.56 | 1.71 | 1.81 | 1.87 | 1.95 | 2.32 | 2.23 |
| | | Volume Expansion Rate (%) | 117.6 | 111.5 | 103.4 | 96.4 | 92.3 | 83.3 | 75.9 |
| | | MX Volume Ratio (wt %) | 81.6 | 77.3 | 71.8 | 66.9 | 64 | 57.8 | 52.7 |
| | | Metal Adhesion | Very Excellent | Very Excellent | Excellent | Excellent | Excellent | Poor | Poor |
| | 100 | Moisture Penetration (mm) | Cracking | 1.54 | 1.73 | 1.78 | 1.82 | 2.34 | 2.54 |
| | | Volume Expansion Rate (%) | 119.1 | 113.1 | 105 | 98.1 | 93.9 | 84.9 | 77.5 |
| | | MX Volume Ratio (wt %) | 80 | 75.9 | 70.5 | 65.8 | 63 | 57 | 52 |
| | | Metal Adhesion | Very Excellent | Very Excellent | Excellent | Excellent | Excellent | Poor | Poor |
| | 110 | Moisture Penetration (mm) | Cracking | 1.47 | 1.59 | 1.72 | 1.75 | 2.4 | 2.09 |
| | | Volume Expansion Rate (%) | 120.6 | 114.6 | 106.6 | 99.6 | 95.5 | 86.5 | 79 |
| | | MX Volume Ratio (wt %) | 78.4 | 74.5 | 69.3 | 64.7 | 62 | 56.2 | 51.3 |
| | | Metal Adhesion | Very Excellent | Very Excellent | Excellent | Excellent | Excellent | Poor | Poor |
| | 120 | Moisture Penetration (mm) | Cracking | 1.43 | 1.46 | 1.6 | 1.6 | 2.65 | 2.13 |
| | | Volume Expansion Rate (%) | 122.1 | 116.1 | 108.1 | 101.2 | 97 | 88 | 80.5 |
| | | MX Volume Ratio (wt %) | 76.9 | 73.1 | 68.1 | 63.7 | 61.1 | 55.4 | 50.7 |
| | | Metal Adhesion | Very Excellent | Very Excellent | Excellent | Excellent | Excellent | Poor | Poor |
| | 130 | Moisture Penetration (mm) | Cracking | 1.39 | 1.42 | 1.47 | 1.59 | 2.55 | 2.32 |
| | | Volume Expansion Rate (%) | 123.5 | 117.5 | 109.6 | 102.7 | 98.5 | 89.5 | 81.9 |
| | | MX Volume Ratio (wt %) | 75.4 | 71.8 | 66.9 | 62.7 | 60.2 | 54.6 | 50.1 |
| | | Metal Adhesion | Very Excellent | Very Excellent | Excellent | Excellent | Excellent | Poor | Poor |
| | 140 | Moisture Penetration (mm) | Cracking | Cracking | 1.39 | 1.43 | 1.72 | 2.32 | 2.25 |
| | | Volume Expansion Rate (%) | 124.8 | 118.9 | 111 | 104.1 | 100 | 90.9 | 83.3 |
| | | MX Volume Ratio (wt %) | 74 | 70.5 | 65.8 | 61.7 | 59.3 | 53.9 | 49.4 |
| | | Metal Adhesion | Very Excellent | Excellent | Excellent | Excellent | Poor | Poor | Poor |

Referring to Table 5, "MX" denotes the first bonding component material. In Table 5, the content of the moisture absorbent, relative to 100 wt % of the first bonding component material, of each of the adhesive films according to Preparation Examples 20 through 61 and Comparative Examples 9 through 15 is shown in the second column from the left, and the content of the first core shell particles, relative to 100 wt % of the first bonding component material, of each of the adhesive films according to Preparation Examples 20 through 61 and Comparative Examples 9 through 15 is shown in the second row from the top. Also, in Table 5, the moisture penetration lengths of the adhesive films according to Preparation Examples 20 through 61 and Comparative Examples 9 through 15 and the volume ratios and the metal adhesion performances of the first bonding layers of the adhesive films according to Preparation Examples 20 through 61 and Comparative Examples 9 through 15 are shown. The volume expansion rates shown in Table 5 were obtained using Equation 2 above. In Table 5, volume expansion rates of 100% or less do not mean the contraction of adhesive films, but mean that the adhesive films did not swell from moisture absorption, and the actual volume expansion rate of the adhesive films would be 100%.

As shown in Table 5, adhesive films in which the content of the first bonding component material was 60 wt % or less had poor metal adhesion. When the content of the first bonding component material was 60 wt % or more at each given content of the core shell particles, the moisture penetration length generally decreased as the content of the moisture absorbent increased. However, when the content of the first bonding component material was 60 wt % or less, no particular correlation was observed between the content of the moisture absorbent and the moisture penetration length.

Also, at each given content of the moisture absorbent, the volume expansion rate decreased as the content of the first core shell particles increased. As the content of the first core shell particles increased, the moisture penetration length increased, and this may be because the density of the moisture absorbent in a given volume decreased because of the first core shell particles being larger in volume than the moisture absorbent.

Cracking was observed from adhesive films with volume expansion rates of higher than 118%.

In the case of the adhesive films according to Comparative Examples 9 through 15 having no first core shell particles, the moisture penetration length was reduced to 1.56 mm when the content of the moisture absorbent was increased to 90 wt %, but once the content of the moisture absorbent exceeded 100 wt %, the volume expansion rate exceeded 118%, and cracking occurred. That is, when the first core shell particles were not included, the moisture penetration length could not be reduced to or below 1.5 mm without causing cracking.

In the case of the adhesive films according to Preparation Examples 20 through 26 in which the first core shell particles were added in an amount of 0.2 wt %, the moisture penetration length decreased as the content of the moisture absorbent increased, and when the moisture absorbent was added in an amount of 110 wt % or more, the moisture penetration length was 1.5 mm or less. However, when the moisture absorbent was added in an amount of 140 wt %, the volume expansion rate exceeded 118%, and cracking occurred.

In the case of the adhesive films according to Preparation Examples 27 through 33 in which the moisture absorbent was added in an amount of 120 wt %, the moisture penetration length was 1.5 mm or less. Even when the moisture absorbent was added in an amount of 140 wt %, the volume expansion rate was only 111%. Thus, no cracking occurred, and a favorable moisture penetration length of 1.39 mm was observed.

In the case of the adhesive films according to Preparation Examples 34 through 40 in which the first core shell particles were added in an amount of 0.8 wt %, the moisture penetration length was 1.5 mm or less when the content of the moisture absorbent was 130 wt % or more. Even when the moisture absorbent was added in an amount of 140 wt %, the volume expansion rate was only 104.1%. Thus, no cracking occurred, and a favorable moisture penetration length of 1.43 mm was observed.

In the case of the adhesive films according to Preparation Examples 41 through 47 in which the first core shell particles were added in an amount of 1 wt %, the moisture penetration length was only 1.59 mm even when the content of the moisture absorbent was increased up to 130 wt %. However, when the moisture absorbent was added in an amount of 140 wt %, the volume expansion rate was 60 wt % or less, a poor metal adhesion was observed, and the moisture penetration length was increased to 1.72 mm.

In the case of the adhesive films according to Preparation Examples 48 through 61 in which the first core shell particles were added in an amount of 1.5 wt % or 2 wt %, the content of the first bonding component material was less than 60 wt %, a poor metal adhesion was observed, and the moisture penetration length exceeded 2 mm.

While exemplary embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure. Additionally, the features of various implementing embodiments may be combined to form further exemplary embodiments of the present disclosure.

What is claimed is:

1. An adhesive film comprising:
   a first bonding layer including a first bonding component layer, a moisture absorbent, and first core shell particles; and
   a second bonding layer disposed below the first bonding layer and including second core shell particles, which are formed of a different material from the first core shell particles,
   wherein
   each of the first core shell particles includes a first shell and a first core surrounded by the first shell,
   each of the second core shell particles includes a second shell and a second core surrounded by the second shell,
   a shrinkage deformation force of the first core shell particles is weaker than a surface deformation force of the first bonding component layer so that the first core shell particles are more easily deformable than the first bonding component layer, and
   the first core is empty or filled with a gas.

2. The adhesive film of claim 1, wherein
   a diameter of the first core is greater than a thickness of the first shell, and
   a diameter of the second core is greater than a thickness of the second shell.

3. The adhesive film of claim 2, wherein each of the first core shell particles further includes a surface coating layer formed on a surface of the first shell.

4. The adhesive film of claim 3, wherein the surface coating layer contains calcium carbonate.

5. The adhesive film of claim 1, wherein the first core shell particles are foamed particles.

6. The adhesive film of claim 1, wherein the first core shell particles absorb at least some of a deformation force generated when the moisture absorbent absorbs moisture.

7. The adhesive film of claim 1, wherein a content of the first core shell particles is 0.01% to 3% by weight of the moisture absorbent.

8. The adhesive film of claim 1, wherein
the first core shell particles have a larger size than the second core shell particles,
a thickness of the first bonding layer is greater than a thickness of the second bonding layer, and
a content of the second core shell particles in the entire adhesive film is greater than a content of the first core shell particles in the entire adhesive film.

9. The adhesive film of claim 1, wherein a ratio of an average size of the first core shell particles to an average size of the second core shell particles is greater than a ratio of a thickness of the first bonding layer to a thickness of the second bonding layer.

10. The adhesive film of claim 1, wherein
the second bonding layer further includes a second bonding component layer, and
the second bonding component layer includes a binder having a smaller molecular weight than the first bonding component layer.

11. The adhesive film of claim 1, wherein the second core shell particles contain a polymer material.

12. The adhesive film of claim 11, wherein a content of the second core shell particles is 20% by weight of the moisture absorbent.

13. The adhesive film of claim 1, wherein the first bonding layer is disposed further apart than the second bonding layer from an object to be encapsulated.

14. An organic electronic device comprising:
a substrate;
an organic material element disposed on the substrate; and
an adhesive film disposed on the organic material element,
wherein the adhesive film comprises:
a first bonding layer including a first bonding component layer, a moisture absorbent, and first core shell particles, and
a second bonding layer disposed below the first bonding layer and including second core shell particles, which are formed of a different material from the first core shell particles,
wherein
each of the first core shell particles includes a first shell and a first core surrounded by the first shell,
each of the second core shell particles includes a second shell and a second core surrounded by the second shell,
a shrinkage deformation force of the first core shell particles is weaker than a surface deformation force of the first bonding component layer so that the first core shell particles are more easily deformable than the first bonding component layer, and
the first core is empty or filled with a gas.

15. The adhesive film of claim 14, wherein
a diameter of the first core is greater than a thickness of the first shell, and
a diameter of the second core is greater than a thickness of the second shell.

16. The adhesive film of claim 15, wherein each of the first core shell particles further includes a surface coating layer formed on a surface of the first shell and
wherein the surface coating layer contains calcium carbonate.

17. The adhesive film of claim 14, wherein a ratio of an average size of the first core shell particles to an average size of the second core shell particles is greater than a ratio of a thickness of the first bonding layer to a thickness of the second bonding layer.

18. The adhesive film of claim 14, wherein the first core shell particles are foamed particles.

19. The adhesive film of claim 14, wherein the first core shell particles absorb at least some of a deformation force generated when the moisture absorbent absorbs moisture.

20. The adhesive film of claim 14, wherein a content of the first core shell particles is 0.01% to 3% by weight of the moisture absorbent.

* * * * *